United States Patent
Pan et al.

(10) Patent No.: US 10,643,941 B2
(45) Date of Patent: May 5, 2020

(54) SEMICONDUCTOR DEVICE

(71) Applicant: Nexperia B.V.

(72) Inventors: Zhihao Pan, Hamburg (DE); Friedrich Hahn, Schenefeld (DE); Steffen Holland, Hamburg (DE); Olaf Pfennigstorf, Hamburg (DE); Jochen Wynants, Hamburg (DE); Hans-Martin Ritter, Hamburg (DE)

(73) Assignee: Nexperia B.V., Nijmegan (NL)

( * ) Notice: Subject to any disclaimer, the term of this patent is extended or adjusted under 35 U.S.C. 154(b) by 93 days.

(21) Appl. No.: 14/988,443

(22) Filed: Jan. 5, 2016

(65) Prior Publication Data

US 2016/0218058 A1 Jul. 28, 2016

(30) Foreign Application Priority Data

Jan. 27, 2015 (EP) .................................. 15152673

(51) Int. Cl.
*H01L 23/498* (2006.01)
*H01L 23/532* (2006.01)
(Continued)

(52) U.S. Cl.
CPC ...... *H01L 23/49844* (2013.01); *H01L 21/743* (2013.01); *H01L 21/78* (2013.01);
(Continued)

(58) Field of Classification Search
CPC ........... H01L 23/3114; H01L 23/49513; H01L 27/088; H01L 29/0657; H01L 23/49844;
(Continued)

(56) References Cited

U.S. PATENT DOCUMENTS 6,515,330 B1 * 2/2003 Hurtz .................. H01L 29/7811
257/328
6,756,687 B1 * 6/2004 Nguyen ................ H01L 21/563
257/737
(Continued)

FOREIGN PATENT DOCUMENTS

EP    1 848 031 A1    11/2007
EP    1 793 426 A2    6/2008
(Continued)

OTHER PUBLICATIONS

Nozomi et al. English Machine Translation of JP Publication No. 2010-206235, Sep. 16, 2010; (Machine Translated Jan. 20, 2019) (Year: 2010).*

(Continued)

*Primary Examiner* — Mohsen Ahmadi
(74) *Attorney, Agent, or Firm* — Ohlandt, Greeley, Ruggiero & Perle, L.L.P.

(57) ABSTRACT

A semiconductor device and a method of making the same. The device includes a semiconductor substrate provided in a chip-scale package (CSP). The device also includes a plurality of contacts provided on a major surface of the substrate. The device further includes an electrically floating metal layer forming an ohmic contact on a backside of the semiconductor substrate. The device is operable to conduct a current that passes through the substrate from a first of said plurality of contacts to a second of said plurality of contacts via the metal layer on the backside.

10 Claims, 6 Drawing Sheets

(51) Int. Cl.
*H01L 21/74* (2006.01)
*H01L 21/78* (2006.01)
*H01L 29/866* (2006.01)
*H01L 29/861* (2006.01)
*H01L 29/872* (2006.01)
*H01L 29/06* (2006.01)
*H01L 29/74* (2006.01)
*H01L 23/00* (2006.01)
*H01L 29/78* (2006.01)
*H01L 27/02* (2006.01)
*H01L 23/31* (2006.01)
*H01L 29/45* (2006.01)

(52) U.S. Cl.
CPC .. *H01L 23/49811* (2013.01); *H01L 23/49827* (2013.01); *H01L 23/53209* (2013.01); *H01L 29/861* (2013.01); *H01L 29/866* (2013.01); *H01L 29/872* (2013.01); *H01L 23/3114* (2013.01); *H01L 24/13* (2013.01); *H01L 24/16* (2013.01); *H01L 27/0248* (2013.01); *H01L 29/0649* (2013.01); *H01L 29/0657* (2013.01); *H01L 29/45* (2013.01); *H01L 29/74* (2013.01); *H01L 29/78* (2013.01); *H01L 2224/131* (2013.01); *H01L 2224/16227* (2013.01)

(58) Field of Classification Search
CPC .............. H01L 23/53209; H01L 21/78; H01L 23/49827; H01L 29/45; H01L 29/49827; H01L 29/872; H01L 29/861; H01L 21/743
See application file for complete search history.

(56) References Cited

U.S. PATENT DOCUMENTS

| | | | |
|---|---|---|---|
| 6,858,471 B1* | 2/2005 | Korec | H01L 29/0657 257/E29.022 |
| 7,915,740 B2* | 3/2011 | Yoshida | H01L 27/0207 257/330 |
| 2003/0057503 A1* | 3/2003 | Yoneda | H01L 27/088 257/401 |
| 2006/0125040 A1* | 6/2006 | Levin | H01L 27/0629 257/471 |
| 2009/0079072 A1* | 3/2009 | Mizusawa | H01L 23/3114 257/738 |
| 2010/0123225 A1* | 5/2010 | Gruenhagen | H01L 23/3114 257/666 |
| 2011/0230046 A1* | 9/2011 | Gruenhagen | H01L 23/49513 438/652 |
| 2014/0166204 A1 | 6/2014 | Earnshaw et al. | |
| 2015/0162257 A1* | 6/2015 | Xue | H01L 23/3114 257/621 |
| 2017/0163030 A1* | 6/2017 | Dickey | H02H 9/04 |

FOREIGN PATENT DOCUMENTS

| | | |
|---|---|---|
| EP | 2 802 013 A1 | 11/2014 |
| JP | 2007-142272 A | 6/2007 |
| JP | 2007-317839 A | 12/2007 |
| JP | 2010-026235 A | 9/2010 |

OTHER PUBLICATIONS

Extended European Search Report for EP Patent Appln. No. 15152673.8 (dated Nov. 12, 2015).

* cited by examiner

SEMICONDUCTOR DEVICE

CROSS-REFERENCE TO RELATED APPLICATIONS

This application claims the priority under 35 U.S.C. § 119 of European Patent application no. 15152673.8, filed on Jan. 27, 2015, the contents of which are incorporated by reference herein.

FIELD OF THE INVENTION

This invention relates to a semiconductor device. In particular, this invention relates to a semiconductor device that can be provided as a chip scale package (CSP).

BACKGROUND OF THE INVENTION

Existing discrete semiconductor devices that handle large currents (such as transient voltage surge devices, Schottky diodes, bipolar transistors and vertical MOS devices) generally include electrical contacts on the top and the back of a semiconductor substrate. In such devices, the main current flows between the contact on the top and the contact on the back of the substrate. Accordingly, the current is generally distributed evenly over the whole bulk of the substrate.

When surface-mount device (SMD) packages were introduced, the problem of connecting the top contact to the same plane as the back contact was solved by using bond wires or clips.

With the further trend to miniaturisation, smaller packages are needed. In devices that handle large currents, the conductivity of silicon or other semiconductor materials is limited and accordingly it is generally not possible to shrink the size of the substrate. Because of this, it is necessary to maximise the ratio of volume of the substrate to the volume of the package.

Chip scale packages (CSPs), especially flip chip packages, can provide having a relatively large substrate volume with a relatively small package size. In some CSPs, nearly 100% of the package volume is silicon.

In CSPs, the contacts of the device are located on a common surface of the substrate. An example of such a device 100 is shown in FIG. 1. The device 100 includes a semi-conductor substrate 112 having a major surface 102. A first contact 104 and a second contact 106 are provided on the major surface 102. In use, the substrate 112 can be mounted with the major surface 102 facing downwards, with the contacts 104 and 106 soldered to a carrier (for example, a printed circuit board (PCB)).

A disadvantage of this approach is that the current flow within the substrate 112 is lateral (this is illustrated by the arrows in FIG. 1), which can lead to current crowding and local heating, which can greatly reduce the robustness of the device. In particular, and as illustrated by the arrows showing the current flow in FIG. 1, the current distribution within the substrate 112 is generally uneven, with higher current densities being present at the edges of the contacts 104 and 106 that are closest together. The uneven current distribution, current crowding and associated local heating can severely affect the current handling capabilities of such a device, particularly where it is intended that the device should handle larger currents. Accordingly, a device of the kind shown in FIG. 1 may not be suitable for certain high current applications.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device. The device includes a semiconductor substrate provided in a chip-scale package (CSP). The device also includes a plurality of contacts provided on a major surface of the substrate. The device further includes an electrically floating metal layer forming an ohmic contact on a backside of the semiconductor substrate. The device is operable to conduct a current that passes through the substrate from a first of said plurality of contacts to a second of said plurality of contacts via the metal layer on the backside.

The provision of an electrically floating metal layer on the backside of the substrate may enable a current having a generally even current distribution to flow within the bulk of the substrate. Currents flowing from the first contact to the second contact may tend not to have high current densities at the edges of the contacts that are closest together. This is because current need not flow directly through the bulk of the substrate from the first contact to the second contact. Instead, the current may flow initially from the first contact to the metal layer on the backside (which, being a metal, has a lower resistivity than the semiconductor substrate), and then from the metal layer to the second contact (or vice versa).

In the context of this invention, the term "electrically floating" can refer to a metal layer that is not connected to an external potential (such as ground, or some other potential). Accordingly, the metal layer need not be connected to an output pin of the device for making a connection to any such external potential.

According to embodiments of this invention, the semiconductor device may be a discrete device as opposed to an integrated circuit.

Either the first contact or the second contact may be electrically connected to the electrically floating metal layer by an electrically conductive portion such as one or more metal filled trenches or vias extending through the substrate from the first or second contact to the electrically floating metal layer. This can lower the resistance of the overall current path between the contacts.

In one embodiment, the substrate may be thinner in the vicinity of at least one of the contacts than it is outside an active region of the device. This can reduce the electrical resistance of the path between the contact and the metal layer on the backside. The thinner part of the substrate may be formed from one or more grooves located on the backside of the substrate. The grooves may be etched into the backside during manufacture.

In one embodiment an electrically conductive portion may extending from the metal layer on the backside, partially through the substrate toward one or more of the contacts. Again, this can reduce the resistance of the path between the contact and the metal layer on the backside. The electrically conductive portion extending from the metal layer on the backside may for instance be one or more vias and/or trenches containing metal.

The metal layer may only contact only those parts of the backside of the substrate that are located substantially opposite the contacts on the major surface. This can allow the resulting current distribution to be optimised for factors such as low on-resistance, high current carrying capability and in general for even current distribution and low current crowding. 3D-simulation techniques may be used for optimizing the contacted area.

In one embodiment, a barrier may be located in the substrate between the first contact and the second contact, for at least partially blocking direct current flow between the first contact and the second contact. This can act to route current towards the metal layer on the backside of the substrate, thereby further improving the current distribution in the bulk of the substrate. The barrier may, for example, be a trench containing a dielectric, which extends down from the major surface into and at least partially through the substrate.

In one embodiment, at least one of the contacts may at least partially surround another of the plurality of contacts on the major surface. It has been found that this arrangement can further improve the current handling capability of the device.

The device may have two contacts. The semiconductor device may, for instance, be a pn-junction diode (for instance a transient voltage suppression diode) or a Schottky diode in which the first contact is a cathode the second contact is an anode. Other examples of devices according to embodiments having two contact include Shockley diodes, silicon controlled rectifiers (SCRs) and ground gated NMOS transistors.

In another example, the device may include a third contact. In such examples, the device may be a bipolar transistor in which the first contact is an emitter contact, the second contact is a collector contact, and the third contact is a base contact. Alternatively, the device may be a MOS transistor (for instance, a vertical MOS transistor) in which the first contact is a source contact, the second contact is a drain contact, and the third contact is a gate contact.

The semiconductor device may be mounted on a carrier such as a printed circuit board. In accordance with an embodiment of the invention, the electrically floating metal layer is not connected any external pin of the device.

According to another aspect of the invention, there is provided a method that includes providing a semiconductor wafer, providing a plurality of contacts on a major surface of the wafer, providing an electrically floating metal layer forming an ohmic contact on a backside of the wafer, and dicing the wafer for making a plurality of semiconductor devices of the kind described above.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide a semiconductor device that includes a semiconductor substrate that is provided in a chip-scale package (CSP). The device can include a plurality of contacts that are provided on a major surface of the substrate, and an electrically floating metal layer than forms an ohmic contact on a backside of the substrate. The provision of the electrically floating metal layer on the backside can provide for a current path within the substrate that produces a generally even current distribution in the bulk, which may avoid problems relating to current crowding such as those described above in relation to FIG. 1. Accordingly, a device according to embodiments of this invention may be operable to handle larger currents than existing devices based on the chip-scale package approach.

The current path within the device may flow from a first of the contacts on the major surface of the substrate down through the bulk of the substrate in a generally vertical direction (orthogonal to the major surface on which the contacts are provided) to reach the metal layer on the backside. The current may then flow through the metal layer on the backside and then pass back up through the bulk of the substrate to reach the second contact on the major surface, again flowing in a generally vertical direction. Current flow within the metal layer on the backside may generally be lateral. Since the metal layer generally will have a resistivity that is far lower than the resistivity of the semi-conductor material used for the substrate (which may, for example, be silicon) the current flow within the device will tend to take the route described above in preference to flowing correctly through the substrate in a generally lateral direction, directly between the first contact and the second contact on the major surface. Nevertheless, it will be appreciated that in some implementations at least a small part of the overall current may still flow laterally within the device.

Figure 2:
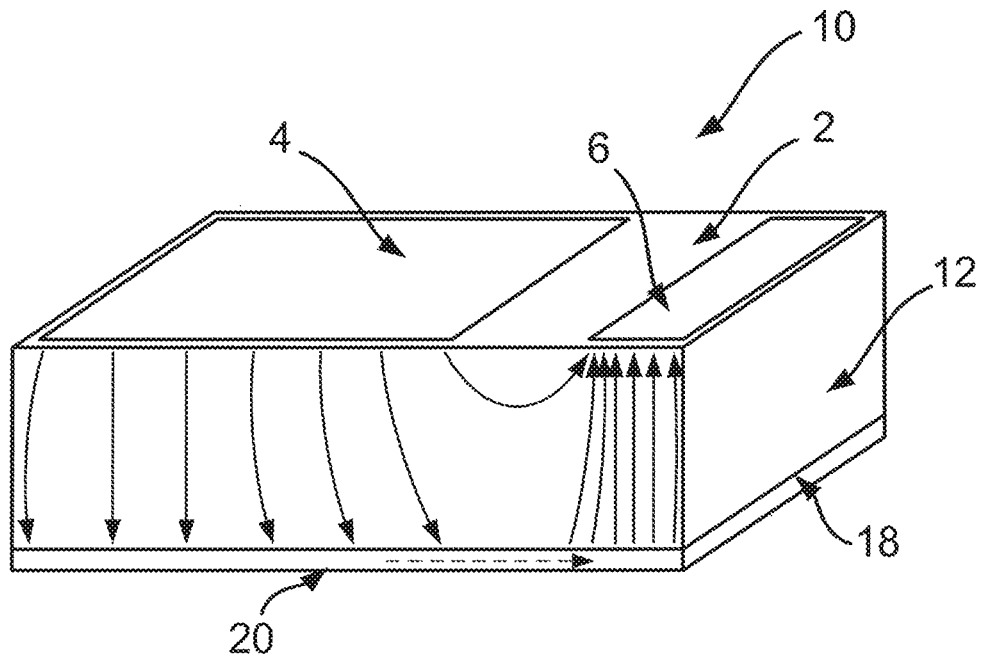
FIG. 2 shows a semiconductor device in accordance with an embodiment of the invention.

FIG. 2 shows a semiconductor device 10 according to a first embodiment of this invention. The semiconductor device 10 includes a semiconductor substrate 12. The substrate 12 may, for example, comprise silicon or any other suitable semiconductor material. As will be described later in more detail, the substrate 12 may be a die that is diced from a larger wafer during manufacture.

In accordance with embodiments of this invention, the substrate 12 is provided in a chip-scale package (CSP). Accordingly, the substrate 12 includes a plurality of contacts that are provided on a major surface 2 thereof. In this example, the plurality of contacts includes a first contact 4 and a second contact 6. This embodiment may, for instance, include a pn-junction diode or a Schottky diode in which the first contact 4 is a cathode of the diode and the second contact 6 is an anode of the diode. As described above, the substrate 12 can be mounted on a carrier such as a printed circuit board (PCB), with the first contact 4 and the second contact 6 being soldered to a mounting surface of the carrier.

In this embodiment, the semiconductor device 10 includes a metal layer 20 that is provided on a backside 18 of the substrate 12. The backside 18 of the substrate 12 is generally the surface of the substrate 12 that is opposite the major surface 2 upon which the plurality of contacts are provided.

The metal layer 20 may be deposited on to the backside 18 of the substrate 12 during back end of line (BEOL) processing. The metal layer 20 can, for instance, comprise a metal such as gold, silver, copper, aluminium, or more complex multiple layers. The thickness of the metal layer may typically be in the range of a few microns.

Current flow through the device from the first contact 4 to the second contact 6 is schematically shown using a series of arrows in FIG. 2. The solid arrows in FIG. 2 show current flow through the bulk of the substrate 12, while the dotted arrow in FIG. 2 shows current flow through the metal layer 20. As can be seen in FIG. 2, current flow within the substrate generally passes through the substrate 12 from the first contact 4 to the metal layer 20, then flows along the metal layer and subsequently back up through the bulk of the substrate 12 to the second contact 6. Accordingly, the current passes through the substrate 12 from the first contact 4 to the second contact 6 via the metal layer 20 on the backside 18. As noted above, it is envisaged that not all of the current flow within the device may take this route and that there may be some residual part of the current that still flows directly from the first contact 4 to the second contact 6 in a generally lateral direction as illustrated by the one of the solid arrows in FIG. 2 (i.e. not via the metal layer 20). Nevertheless, it will be appreciated that most of the current will take the route via the metal layer 20.

As can be appreciated from the solid arrows shown in FIG. 2, the current distribution within the substrate 12 is generally even so that current crowding at the edges of the first contact 4 and the second contact 6 that are closest to each other generally does not occur. Because of the improvement in the homogeneity of the current in the device 10 compared to for example, a device of the kind described above in relation to FIG. 1, the device in this embodiment may be able to handle relatively large currents, enabling applications that may not be achievable using previous devices.

The metal layer 20 is left electrically floating (for example, is not connected to an external voltage such as ground) so as not to otherwise influence the current between the first contact 4 and the second contact 6. Also, it is envisaged that the metal layer 20 should form an ohmic contact at the surface of the backside 18 of the substrate 12 to allow current to pass freely between the substrate 12 and the metal layer 20. The metal layer 20 can have a low sheet resistance, for instance in a range of a few milli-Ohms per square.

The current within the metal layer 20 may generally flow from an area that is closest to the first contact (which is generally directly beneath the first contact 4) to an area that is closest to the second contact 6 (again this is generally an area directly beneath the second contact 6), before re-entering the bulk of the substrate 12 to travel up to arrive at the second contact 6.

In some embodiments, the metal layer 20 on the backside 18 can be covered by an insulating layer (not shown in the Figures) in order to isolate the metal layer 20 and reduce the risk of unwanted electrical contacting to the metal layer 20. The insulating layer can be added during wafer processing, prior to dicing as will be explained in more detail below.

In this example, as noted above, the device may be a Schottky diode. The first contact 4 may for example be the cathode of the device and may for example be a Schottky contact, while the second contact 6 may be an anode of the Schottky diode and may be an ohmic contact.

Figure 3:
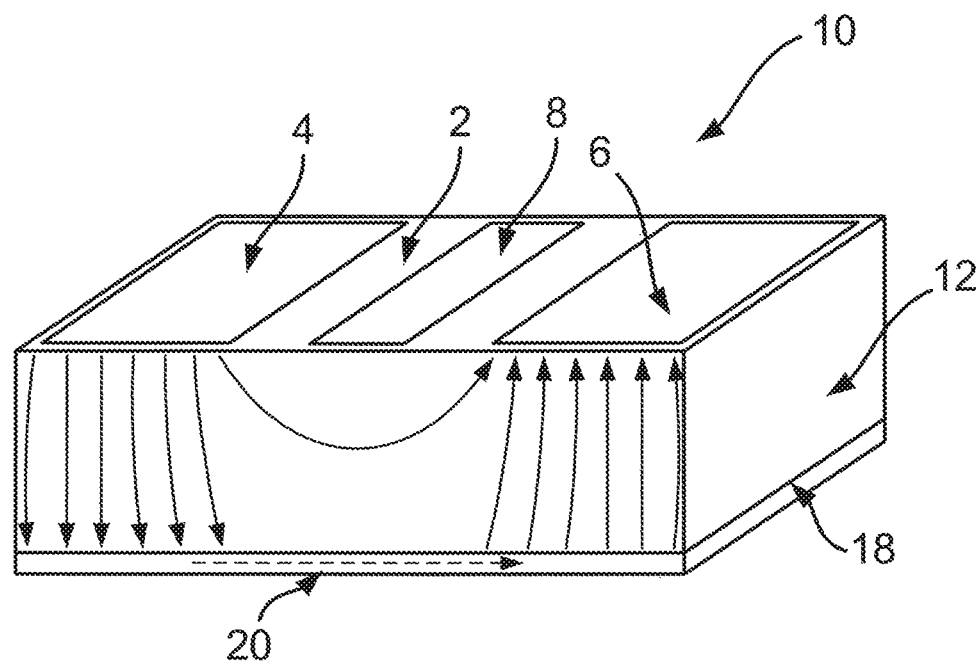
FIG. 3 shows a semiconductor device in accordance with another embodiment of the invention.

FIG. 3 shows a semiconductor device 10 in accordance with a second embodiment of this invention. In this embodiment, the device 10 includes a substrate 12 that has a major surface 2 on which are provided a plurality of contacts including a first contact 4, a second contact 6 and also a third contact 8. In this embodiment, the device 10 may be a MOS transistor (for instance, a vertical MOS transistor) in which the first contact 4 is a source contact of the transistor, the second contact 6 is a drain contact of the transistor and the third contact 8 is a gate contact of the transistor. In another example, the device 10 may comprise a bipolar transistor in which the first contact 4 is an emitter contact of the transistor, the second contact 6 is a collector contact of the transistor and the third contact 8 is a base contact of the transistor.

As can be seen from the solid arrows in FIG. 3, the distribution of the current flow within the bulk of the substrate 12 in the device of FIG. 3 is generally even and current crowding at the edges of the contacts is again avoided. Again, although most of the current in the example of FIG. 3 would take a route that passes through the substrate 12 from the first contact 4 to the second contact 6 via the metal layer 20 provided on the backside 18 of the substrate 12, as illustrated by one of the solid arrows in FIG. 3, it is envisaged that a relatively small portion of the overall current may still pass directly through the substrate 12 in a generally lateral direction from the first contact 4 to the second contact 6 without going via the metal layer 20.

Figure 1:
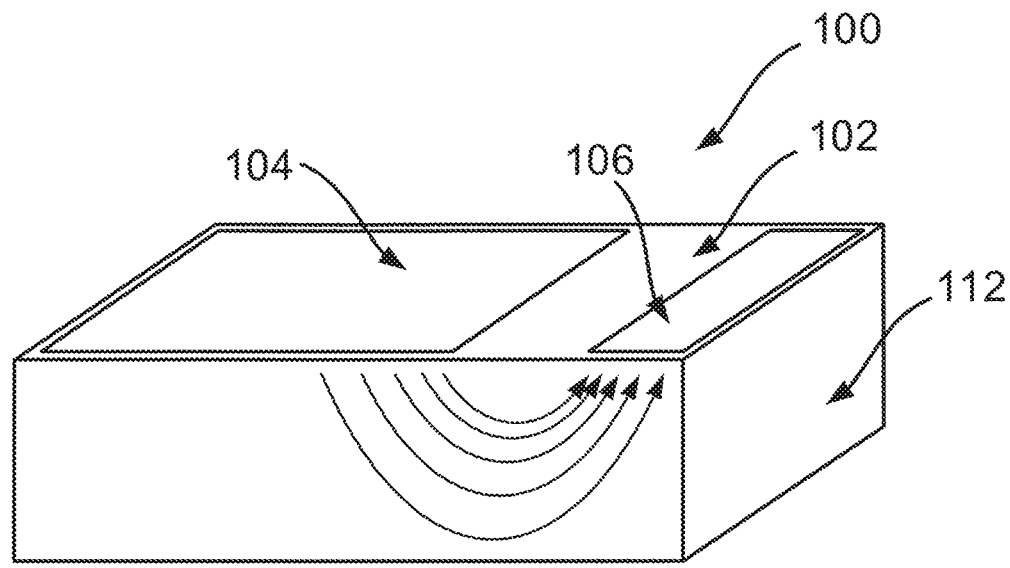
FIG. 1 shows a known kind of semiconductor device.
Figure 4:
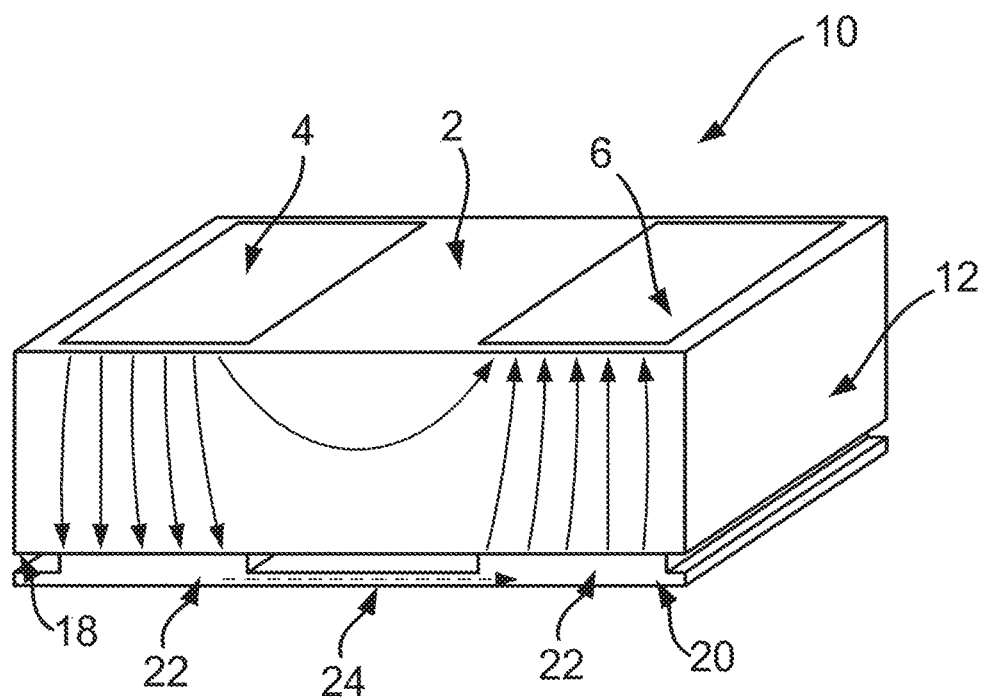
FIG. 4 shows a semiconductor device in accordance with a further embodiment of the invention.

FIG. 4 illustrates another semiconductor device 10 in accordance with another embodiment of this invention. The example of the invention shown in FIG. 4 can, for example, be used to implement a transient voltage suppressor device. In the embodiment of FIGS. 1 and 2 for instance, the metal layer 20 generally covers the entire backside 18 of the substrate 12. However, in the example of FIG. 4, the metal layer 20 does not make contact with the entire backside 18 of the substrate 12. Instead, the metal layer 20 in FIG. 4 only makes contact with those parts of the backside 18 of the substrate 12 that are located substantially opposite or beneath the contacts (in the present example this includes the contacts 4 and 6) on the major surface 2.

To implement this, the metal layer 20 may be patterned using known metallisation techniques. For instance, the metal layer 20 may include portions 22 that are in contact with the backside 18 in those parts of the backside 18 that are located substantially opposite the contacts on the major surface 2. Linking portions 24 may connect the portions 22 together to allow current to flow laterally within the metal layer 20. Any gap between the linking portions 24 and the backside 18 may be filled with dielectric.

The layout of the metal layer 20 can be chosen such that the resulting current distribution in the bulk of the substrate 12 for a given application is optimised for parameters such as low on resistance, high current carrying capability and in general for even current distribution and low current crowding. For designing such a device, 3D-simulations can be used to optimise the contact areas between the metal layer 20 and the backside 18.

Although in FIG. 4 it is shown that the major surface 2 is provided with a first contact 4 and a second contact 6, it will be appreciated that a third contact such as the contact 8 described above in relation to FIG. 3 may also be provided. It will be appreciated that there is no need to allow contact of the metal layer 20 with the backside 18 at a position directly beneath the third contact, since current flow in either a MOS transistor or a bipolar transistor would be between the first contact 4 and the second contact 6.

Figure 5:
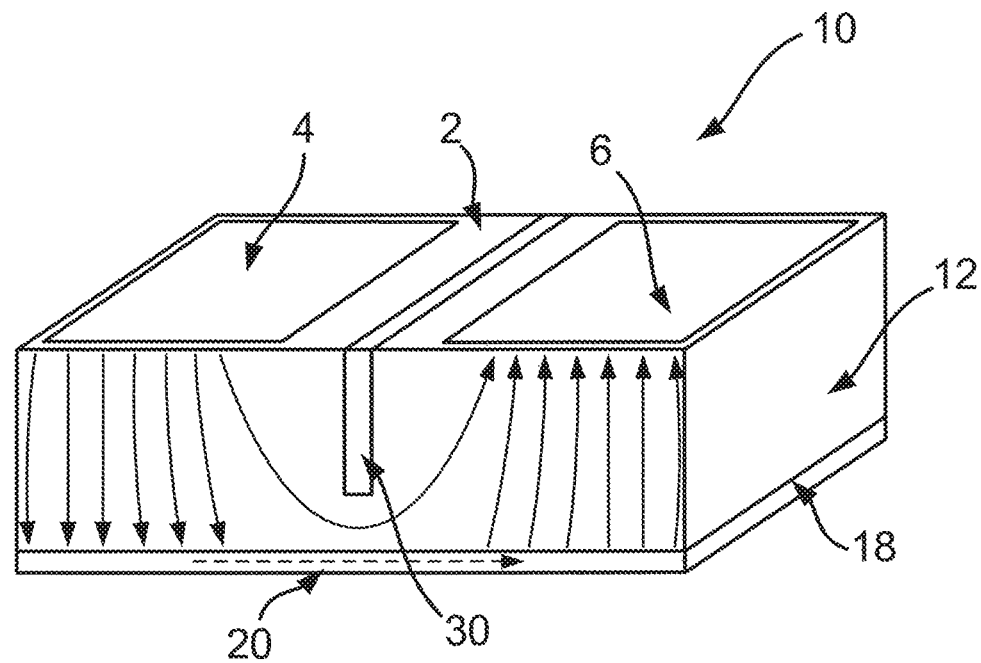
FIG. 5 shows a semiconductor device in accordance with another embodiment of the invention.

FIG. 5 shows a semiconductor device 10 in accordance with a further embodiment of this invention. In this example, a barrier 30 is provided in the substrate 12. The barrier 30 can act to at least partially block direct current flow between the first contact 4 and the second contact 6, thereby increasing the proportion of the overall current that flows between the first contact 4 and the second contact 6 via the metal layer 20 on the backside 18. This is because the route taken by any current passing directly from the first contact 4 to the second contact 6 through the bulk would need to travel beneath the barrier 30, increasing the path length of such a route and thus presenting a greater resistance to such current a current compared to the current path that includes the metal layer 20.

The shape of the barrier 30 may, in some examples, be chosen to conform to the shape and layout of the contacts on the major surface.

In this example, the barrier 30 comprises a trench that extends from the major surface 2 of the substrate 12 at least partially through the substrate 12. The trench may be formed by etching. The trench may be filled with a dielectric material. Because more of the current is forced to flow via the metal layer 20, the current distribution within the bulk of the substrate 12 can be further improved in comparison to, for example, the examples described above in relation to FIGS. 2 to 4.

It will be appreciated that the use of a barrier 30 such as that shown in FIG. 5 can be combined with the provision of features of the other embodiments described herein (for instance the third contact as described above in relation to FIG. 3 and/or a patterned metal layer as described in relation to FIG. 4).

Figure 6:
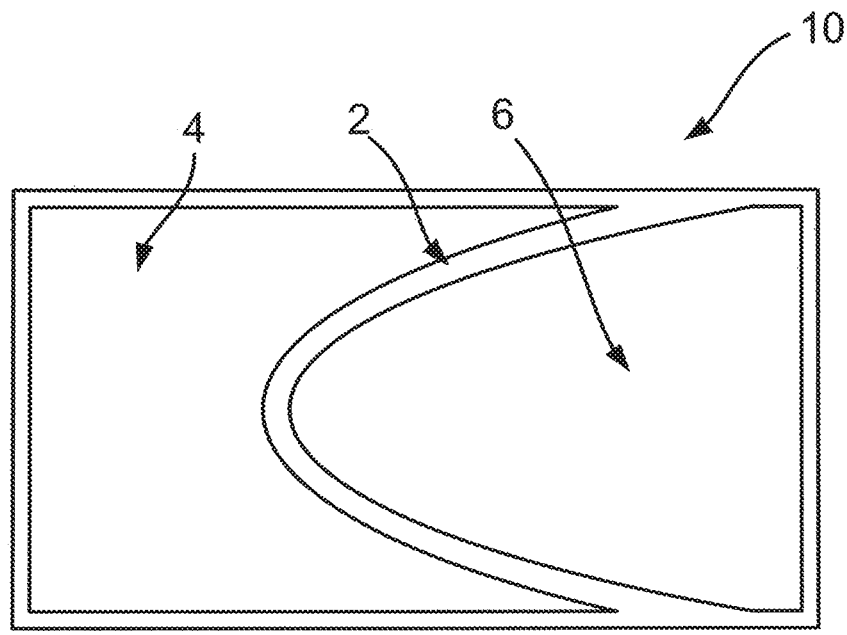
FIG. 6 shows a semiconductor device in accordance with a further embodiment of the invention.

FIG. 6 shows a semiconductor device 10 in accordance with a further embodiment of this invention. The view in FIG. 6 is from above the substrate 12, looking down at the major surface 2. As can be seen in FIG. 6, in this example the device 10 includes a first contact 4 and a second contact 6 on the major surface 2. The layout of the contacts in this example is chosen such that the first contact 4 at least partially surrounds the second contact 6. For instance, in FIG. 6, the second contact 6 is received within a generally U-shaped recess in the first contact 4. An arrangement of this kind has been found to further improve the current handling capability of the device 10. It will be appreciated that the shaping of the contacts in this way can be combined with other features of the invention such as those described above in relation to FIGS. 2 to 5 and also in relation to the further examples provided below.

Although embodiments of this invention can produce a generally even current distribution within the device, because the current is required to pass twice through the bulk of substrate the overall resistance of the current path in the device may still be improved. The examples of the invention described below may address this problem using a number of further features.

Figure 7:
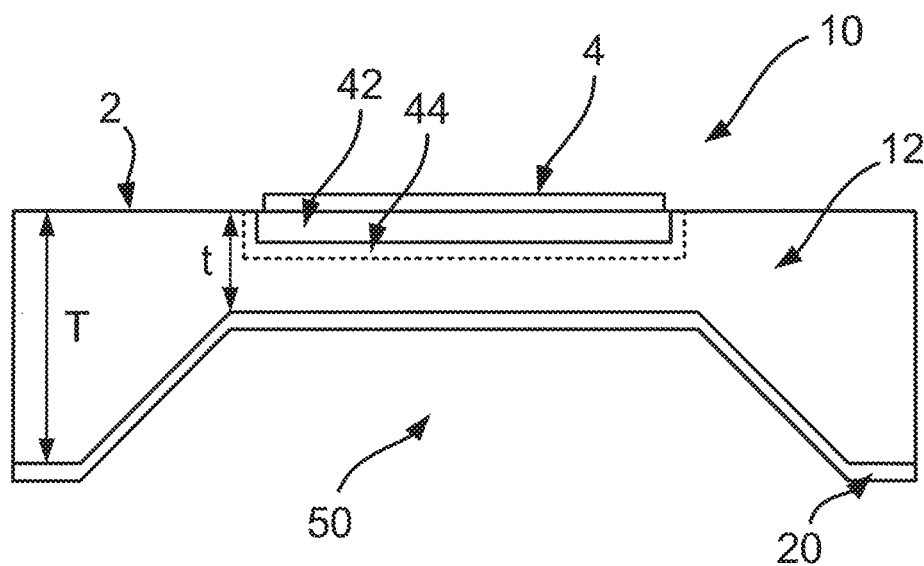
FIG. 7 shows a semiconductor device in accordance with another embodiment of the invention.

FIG. 7 shows a semiconductor device 10 in accordance with another embodiment of this invention. FIG. 7 shows only a portion of the device 10, namely the portion that includes one of the contacts (in the embodiment of FIG. 7, this is the contact 4) on the major surface 2 as described above.

In some embodiments, the substrate may include a pn junction 44 formed between the bulk of the substrate 12 and a portion of semiconductor material 42 that is provided beneath one of the contacts (again, in the example shown in FIG. 7, this is the contact 4). For clarity, the possible presence of such a portion 42 and pn junction 44 was not illustrated in the previously described Figures. Note that the thinner portions (e.g. grooves) described below may be provided in examples that do not include a portion 42 or pn junction of the kind shown in FIG. 7.

In order to reduce the resistance of the path from the first contact 4 to the metal layer 20 provided on the backside of the substrate 12, in this embodiment the substrate 12 is thinner in the vicinity of the contact 4 than it is elsewhere. The thickness t of the substrate 12 in the vicinity of the contact 4 is, for example, smaller than the thickness T of the substrate 12 away from the contact 4 (for instance, outside an active region of the device 10). Accordingly, because the substrate 12 is thinner in the vicinity of the contact 4, the resistive path between the contact 4 and the metal layer 20 is reduced. The thinner part of the substrate 12 in this example is formed by a groove 50 in the backside surface of the substrate 12. The groove 50 may be shaped similarly to the shape of the contact 4 on the opposite surface (when viewed from above the major surface 2) and may be formed using an etching process during wafer processing.

It is envisaged that in some embodiments, the substrate 12 may be thinner in the vicinity of more than one contact. For instance, an area of the substrate 12 including more than one contact may be thinned. For example a relatively wide groove may be provided that encompasses an area including a plurality of contacts. Alternatively, the substrate 12 may be locally thinned in the vicinity of each of a plurality of respective contacts (e.g. a respective groove may be provided for each contact).

It is further envisaged that the provision of a thinner part of the substrate 12 as explained above in relation to FIG. 7 may be implemented in combination with the features of any of the other embodiments described herein.

Figure 8:
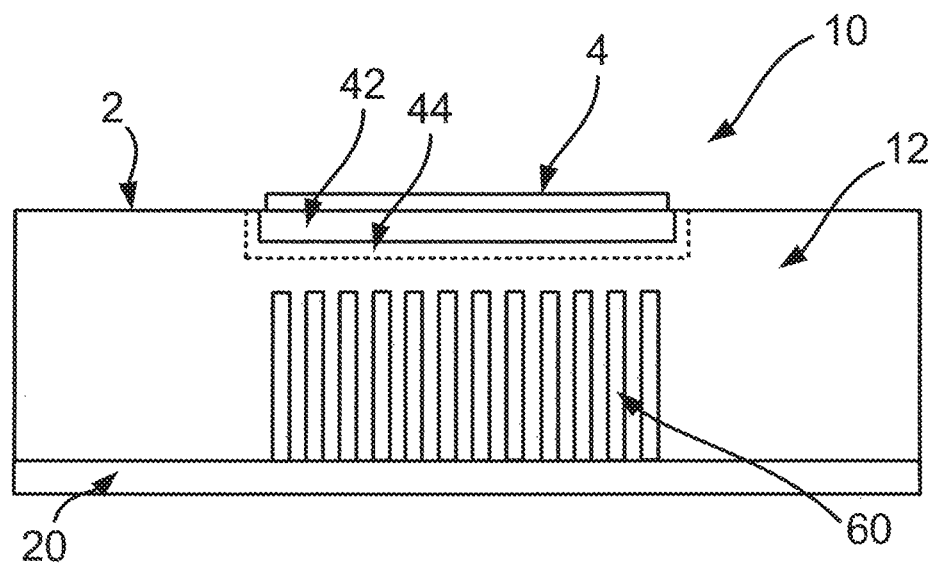
FIG. 8 shows a semiconductor device in accordance with a further embodiment of the invention.

FIG. 8 shows a semiconductor device 10 in accordance with a further embodiment of this invention. In common with FIG. 7, FIG. 8 shows only a part of the device, namely the part of the device that includes the first contact 4. In this example, the device 10 includes an electrically conductive portion that extends from the metal layer 20 on the backside 18, partially through the substrate 12 toward the contact 4. It is envisaged that in other examples, electrically conductive portions of this kind may be provided for other contacts of the device, such as the second contact 6. In one example, both the contact 4 and the contact 6 are provided with electrically conductive portions of this kind. In a further example, the electrically conductive portion(s) may be provided not just for any given contact location but also in other regions of the substrate. For instance, it is envisaged that the trenches and/or vias described below may be provided over a large area of the substrate, or even over the entire substrate. The provision of the electrically conductive portion can lower the overall resistance of the path between the first contact 4 and the metal layer 20.

In the present embodiment, the electrically conductive portion comprises one or more vias that are filled with an electrically conductive material such as a metal. In another example, the electrically conductive portion may comprise one or more trenches, also containing metal. It is envisaged that a combination of vias and trenches may be used. The metal that is used in the vias or trenches may be the same metal that is used to form the metal layer 20 and/or the metals of the top contacts 4, 6 and 8. The vias or trenches can be manufacturing using an etching process during wafer processing.

Figure 9:
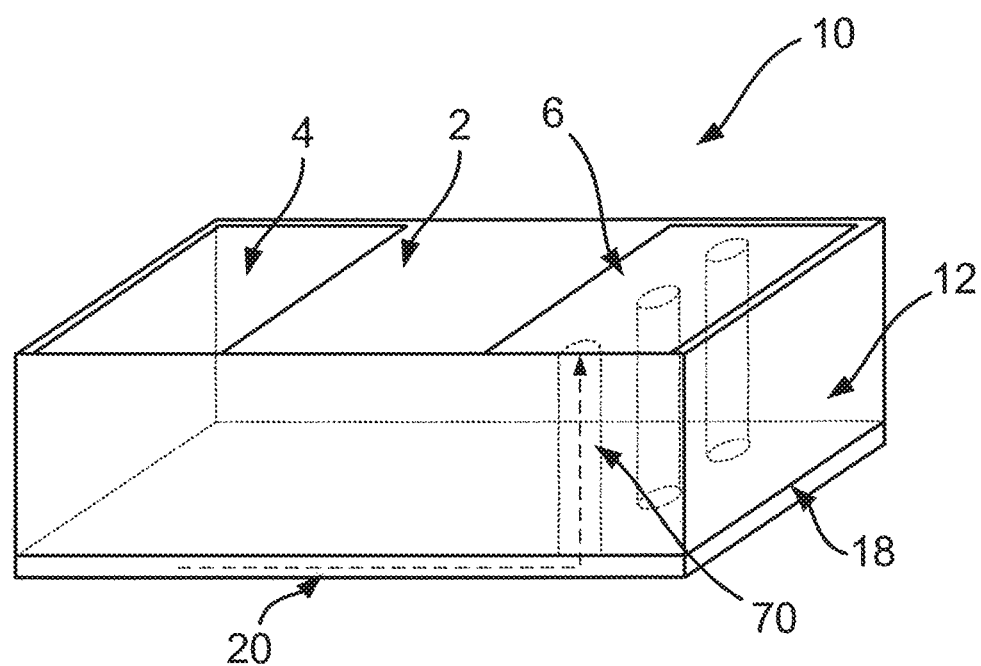
FIG. 9 shows a semiconductor device in accordance with another embodiment of the invention.

FIG. 9 shows a semiconductor device according to another embodiment of this invention. In this example, one of the contacts (in FIG. 9 this is shown to be the second contact 6, but it is envisaged that it may be one of the other contacts of the device such as the contact 4) is electrically connected to the metal layer 20 on the backside 18 of the substrate 12 by an electrically conductive portion 70 that extends through the substrate from the contact 6 to the metal layer 20. The provision of the electrically conductive portion can reduce the overall resistance of the current path between the first contact 4 and the second contact 6 via the metal layer 20. In the present example, the electrically conductive portion includes one or more vias 70 that may contain a metal. It is envisaged that trenches may be used instead of or as well as vias to form the electrically conductive portion. The trenches and/or vias 70 may be filed with a metal that is the same metal as that used to form the metal layer 20 on the backside 18 of the substrate 12 and/or the metals of the top contacts.

It is envisaged that the electrically conductive portions described in relation to FIGS. 8 and 9 can be combined with any of the features of the invention described in relation to FIGS. 2 to 7.

Figure 10:
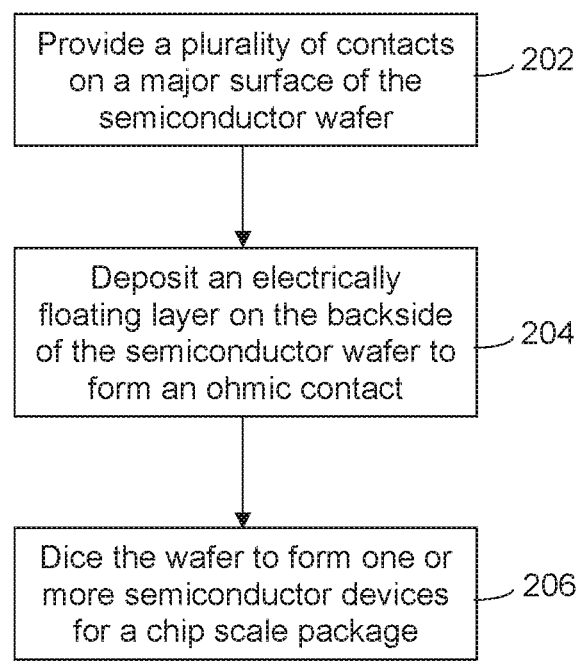
FIG. 10 shows a method to manufacture a device in accordance with an embodiment of this invention.

FIG. 10 shows a method to manufacture a device in accordance with an embodiment of this invention. At block 202, a semiconductor wafer can first be provided with a plurality of contacts on a major surface thereof. In a next step, at block 204, an electrically floating metal layer can be deposited on a backside of the wafer to form an ohmic contact thereto. At block 206, the wafer can then be diced to form one or more semiconductor devices for a chip scale package. Each of the dice from the wafer can form a semiconductor device of the kind described herein. Features of the invention such as the grooves discussed in relation to FIG. 7 and the electrically conductive portion discussed in relation to FIGS. 8 and 9, as well as the layout of the contacts discussed in relation to FIG. 6 and the provision of a patterned metal layer 20 or a barrier described in relation to FIGS. 4 and 5, respectively can be manufactured at wafer level and repeated in each intended die, before the dies are cut individually from the wafer.

Accordingly, there has been described a semiconductor device and a method of making the same. The device includes a semiconductor substrate provided in a chip-scale package (CSP). The device also includes a plurality of contacts provided on a major surface of the substrate. The device further includes an electrically floating metal layer forming an ohmic contact on a backside of the semiconductor substrate. The device is operable to conduct a current that passes through the substrate from a first of said plurality of contacts to a second of said plurality of contacts via the metal layer on the backside.

Although particular embodiments of the invention have been described, it will be appreciated that many modifications/additions and/or substitutions may be made within the scope of the claimed invention.

The invention claimed is:

1. A semiconductor device comprising:
a semiconductor substrate provided in a chip-scale package (CSP);
a plurality of contacts provided on a major surface of the semiconductor substrate, wherein the semiconductor substrate comprises a thinner part that is thinner in a vicinity of at least one of the contacts than it is outside an active region of the semiconductor device, and the thinner part comprises one or more grooves located on a backside of the semiconductor substrate; and
an ohmic contact formed by an electrically floating metal layer on the backside of the semiconductor substrate, wherein the semiconductor device is configured to conduct a current that passes through the semiconductor substrate from a first contact of said plurality of contacts to a second contact of said plurality of contacts via the electrically floating metal layer on the backside of the semiconductor substrate, and
wherein either the first contact or the second contact is electrically connected to the electrically floating metal layer by an electrically conductive portion extending through the semiconductor substrate from the first or second contact to the electrically floating metal layer.

2. The semiconductor device of claim 1, wherein the electrically conductive portion comprises one or more vias and/or trenches containing metal.

3. The semiconductor device of claim 1, wherein at least one of said plurality of contacts at least partially surrounds another of said plurality of contacts on the major surface of the semiconductor substrate.

4. The semiconductor device of claim 1, wherein the semiconductor device is a transient voltage suppression (TVS) diode.

5. The semiconductor device of claim 1, wherein:
said plurality of contacts includes a third contact; and
the semiconductor device comprises a bipolar transistor in which the first contact is an emitter contact, the second contact is a collector contact, and the third contact is a base contact; or
the semiconductor device comprises a MOS transistor in which the first contact is a source contact, the second contact is a drain contact, and the third contact is a gate contact.

6. The semiconductor device of claim 1, wherein the semiconductor device is configured to mount on a surface of a carrier, and wherein the electrically floating metal layer configured not to connect to an external pin of the semiconductor device.

7. A semiconductor device comprising:
a semiconductor substrate provided in a chip-scale package (CSP);
a plurality of contacts provided on a major surface of the semiconductor substrate, wherein the semiconductor substrate comprises a thinner part that is thinner in a vicinity of at least one of the contacts than it is outside an active region of the semiconductor device, and the thinner part comprises one or more grooves located on a backside of the semiconductor substrate; and
an ohmic contact formed by an electrically floating metal layer on the backside of the semiconductor substrate, wherein the semiconductor device is configured to conduct a current that passes through the semiconductor substrate from a first contact of said plurality of contacts to a second contact of said plurality of contacts via the electrically floating metal layer on the backside of the semiconductor substrate, and
wherein the electrically floating metal layer does not contact an entire surface of the backside of the semiconductor substrate and contacts only those parts of the backside of the semiconductor substrate that are located substantially opposite the first contact and the second contact on the major surface of the semiconductor substrate.

8. The semiconductor device of claim 7, wherein the electrically conductive portion extends from the electrically floating metal layer on the backside of the semiconductor substrate, partially through the semiconductor substrate toward one or more of said plurality of contacts.

9. A semiconductor device comprising:
a semiconductor substrate provided in a chip-scale package (CSP);

a plurality of contacts provided on a major surface of the semiconductor substrate;

an ohmic contact formed by an electrically floating metal layer on a backside of the semiconductor substrate; and a barrier comprising a trench containing a dielectric, wherein the trench extends from the major surface of the semiconductor substrate at least partially through the semiconductor substrate, the barrier being located in the semiconductor substrate between a first contact of said plurality of contacts and a second contact of said plurality of contacts, wherein the barrier is configured to partially block direct current flow through the semiconductor substrate between the first contact and the second contact, wherein the semiconductor device is configured to conduct a current that passes through the semiconductor substrate from a first contact of said plurality of contacts to a second contact of said plurality of contacts via the electrically floating metal layer on the backside of the semiconductor substrate.

10. A method comprising:

providing a semiconductor wafer for forming a semiconductor substrate of a semiconductor device;

providing a plurality of contacts on a major surface of the semiconductor wafer;

providing an electrically floating metal layer on a backside of the semiconductor wafer to form an ohmic contact;

providing an electrically conductive portion extending from the electrically floating metal layer on the backside of the semiconductor substrate, at least partially through the semiconductor substrate toward one or more of said plurality of contacts; and dicing the semiconductor wafer to form one or more of the semiconductor devices for a chip-scale package (CSP), wherein each semiconductor device has the semiconductor substrate formed from the diced semiconductor wafer, wherein the one or more semiconductor devices are configured to conduct a current that passes through the semiconductor substrate from a first contact of said plurality of contacts to a second contact of said plurality of contacts via the electrically floating metal layer on a backside of the semiconductor substrate, wherein the electrically floating metal layer does not contact an entire surface of the backside of the semiconductor substrate and contacts only parts of the backside of the semiconductor substrate that are located substantially opposite the surface of the first contact and the surface of the second contact on the major surface of the semiconductor substrate; and wherein the electrically conductive portion extending from the electrically floating metal layer on the backside of the semiconductor substrate comprises one or more vias and/or trenches containing metal.

* * * * *